United States Patent
Hayakawa

(10) Patent No.: US 6,362,515 B2
(45) Date of Patent: Mar. 26, 2002

(54) GAN SUBSTRATE INCLUDING WIDE LOW-DEFECT REGION FOR USE IN SEMICONDUCTOR ELEMENT

(75) Inventor: Toshiro Hayakawa, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/756,199

(22) Filed: Jan. 9, 2001

(30) Foreign Application Priority Data

Jan. 13, 2000 (JP) ............................. 12-004940

(51) Int. Cl.$^7$ ............................................. H01L 23/58
(52) U.S. Cl. ........................................ 257/639; 438/46
(58) Field of Search ......................... 257/103, 13, 15, 257/627, 628, 631, 626, 632, 639, 640, 647; 438/46, 604

(56) References Cited

U.S. PATENT DOCUMENTS 6,046,465 A * 4/2000 Wang et al. ................. 257/98
6,153,010 A * 11/2000 Kiyoku et al. .............. 117/95

FOREIGN PATENT DOCUMENTS

| JP | 10-312971 | 11/1998 | ......... H01L/21/205 |
| JP | 11-312825 | 11/1999 | ........... H01L/33/00 |

OTHER PUBLICATIONS

Patent Abstract of Japan 10–312971 Nov. 24, 1998.

Patent Abstract of Japan 11–312825 Nov. 9, 1999.

Nakamura, Shuji et al, "Violet InGaN/GaN/AlGaN–Based Laser Diodes Operable at 50°C with a Fundamental Transverse Mode", Jpn. J. Appl. Phys., vol. 38 (1999), pp. L226–L229.

Zheleva, Tsvetanka et al, "Pendeo–Epitaxy–A New Approach For Lateral Growth of Gallium Nitride Structures", MRS Internet J. Nitride Semicond. Res. 4S1, (1999), pp. G3–G8.

Nakamura, Shuji, "Three Years of InGaN Quantum–Well Lasers: Commercialization Already" Jan. 1999, SPIE vol. 3628, pp. 158–168.

* cited by examiner

Primary Examiner—David Nelms
Assistant Examiner—Quoc Hoang
(74) Attorney, Agent, or Firm—Sughrue Mion, PLLC

(57) ABSTRACT

A GaN substrate formed with a substrate, a first GaN layer, a first preventing film, a second GaN layer, and a second preventing film. The first GaN layer is formed on the substrate, and includes a plurality of stripe portions which form at least one first groove between adjacent ones of the plurality of stripe portions. The second GaN layer is formed over the substrate and the first GaN layer. The first preventing film is arranged on upper surfaces of the plurality of stripe portions, and prevents crystal growth of a GaN layer in a vertical up direction from the upper surfaces of the plurality of stripe portions. The second preventing film is arranged on at least one bottom surface of the at least one first groove, and prevents crystal growth of a GaN layer in a vertical up direction from the at least one bottom surface.

29 Claims, 4 Drawing Sheets

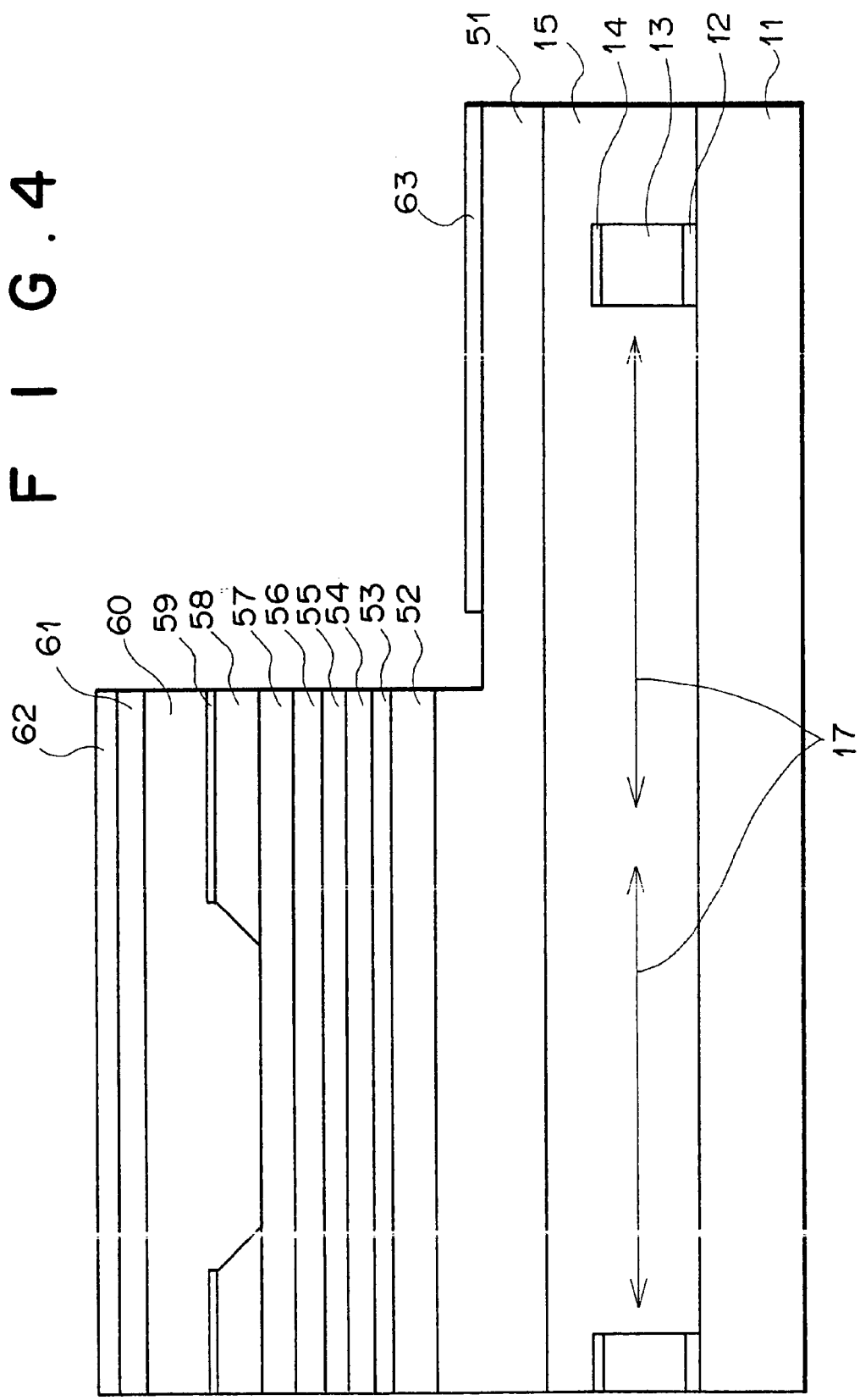

GAN SUBSTRATE INCLUDING WIDE LOW-DEFECT REGION FOR USE IN SEMICONDUCTOR ELEMENT

BACKGROUND OF THE INVENTION

1. Field of the Invention

The present invention relates to a GaN substrate which is used in a semiconductor element, and in which the defect density is low. The present invention also relates to a process for producing a GaN substrate which is used in a semiconductor element, and in which the defect density is low. The present invention further relates to a semiconductor element including a semiconductor laser device which uses a GaN substrate in which the defect density is low.

2. Description of the Related Art

S. Nakamura et al. ("Violet InGaN/GaN/AlGaN-Based Laser Diodes Operable at 50° C. with a Fundamental Transverse Mode," Japanese Journal of Applied Physics, vol. 38 (1999) L226–L229) disclose a short-wavelength semiconductor laser device which emits laser light in the 410 nm band.

This semiconductor laser device is formed as follows. First, a GaN substrate is formed by growing a first GaN layer on a sapphire substrate, selectively growing a second GaN layer by using a $SiO_2$ mask, and removing the sapphire substrate. Then, an n-type GaN buffer layer, an n-type InGaN crack preventing layer, an AlGaN/n-type GaN modulation-doped superlattice cladding layer, an n-type GaN optical waveguide layer, an undoped InGaN/n-type InGaN multiple quantum well active layer, a p-type AlGaN carrier block layer, a p-type GaN optical waveguide layer, an AlGaN/p-type GaN modulation-doped superlattice cladding layer, and a p-type GaN contact layer are formed on the above GaN substrate. However, the defect density in the semiconductor laser device is still high, and therefore the semiconductor laser device is not reliable in the high output power range.

In addition, T. S. Zheleva et al. ("Pendeo-Epitaxy-A New Approach for Lateral Growth of Gallium Nitride Structures," MRS Fall Meeting, Boston, 1998, Extended Abstracts G3.38) report that a flat GaN layer can be formed by utilizing lateral growth of GaN. In the reported process, a first GaN layer is formed without a mask, and then stripe regions of the GaN layer are removed until a sapphire substrate is exposed. Then, a second GaN layer is grown on the exposed sapphire substrate so that the second GaN layer is grown in the lateral directions.

Further, S. Nakamura ("Three Years of InGaN Quantum-well Lasers: Commercialization Already," SPIE Proceedings, Vol. 3628, 1999, pp.158–168) reports that an InGaN-based multiple quantum well semiconductor laser device can be produced by using the above process proposed by T. S. Zheleva et al. However, the semiconductor laser device produced by the process is reliable only when the semiconductor laser device operates with the output power of 5 mW or less. Therefore, it is necessary to further decrease the defect density.

Furthermore, Japanese Unexamined Patent Publication, No. 10 (1998)-312971 discloses a process for preventing occurrence of a defect, such as a crack, which is caused by differences in the thermal expansion and the lattice constant between a GaN compound semiconductor layer and a sapphire substrate crystal. In the process, regions of growth are confined by a mask, facet structures of the GaN compound semiconductor layer are formed by epitaxial growth, and then the facet structures are further grown so that the mask is completely covered, and finally the surface of the grown crystal of the GaN compound semiconductor layer is planarized. However, in this process, the entire base layer on which the above GaN compound semiconductor layer is grown is formed on a substrate, and the lattice-mismatch between the base layer and the substrate is great. Therefore, the GaN compound semiconductor layer is affected by the substrate, the crystal orientations of the GaN compound semiconductor layer grown in lateral directions vary, and it is difficult to planarize the surface of the GaN compound semiconductor layer. Further, even when the above process is repeated, differences arise in the orientations of the crystal faces, and it is therefore impossible to reduce the defect density to a practical level.

Moreover, Japanese Unexamined Patent Publication, No. 11 (1999)-312825 discloses a process for realizing a low-defect region in a GaN layer formed on a GaN base layer by lateral growth, where the GaN base layer is formed on a plurality of portions of a surface of a sapphire substrate. In addition, a dielectric film is formed on the GaN base layer so as to suppress vertical growth from the GaN base layer. However, in this process, the crystal axis is likely to incline due to the mismatch between the sapphire substrate and portions of the GaN layer which are laterally grown over the sapphire substrate, or stress generated in the vicinity of the boundary between the sapphire substrate and the portions of the GaN layer. Further, as mentioned in Japanese Unexamined Patent Publication No. 11 (1999)-312825, a cavity is formed between the sapphire substrate and the laterally grown portions of the GaN layer, and the formation of the cavity is uncontrollable.

In the GaN substrate disclosed in Japanese Journal of Applied Physics, vol. 38 (1999) L226–L229, the $SiO_2$ film stops the dislocation which is caused by the lattice mismatch in the vicinity of the boundary between the GaN substrate and the GaN buffer layer, and extends in the thickness direction. In addition, the aforementioned second GaN layer is formed mainly by the lateral growth from a plurality of portions of the aforementioned first GaN layer which are exposed at a plurality of windows of the $SiO_2$ mask. However, since the laterally grown portions of the second GaN layer coalesce in central portions of a plurality of regions which are located above the remaining $SiO_2$ film of the $SiO_2$ mask, defects tend to gather in the central portions of the plurality of regions above the remaining $SiO_2$ film. In addition, dislocation is likely to extend in the thickness direction, and pass through the above plurality of windows, Therefore, only the above plurality of regions above the remaining $SiO_2$ film other than their central portions are low-defect regions of the second GaN layer. Such low-defect regions each have a width about 4 micrometers. That is, the low-defect regions are very narrow, and the semiconductor laser devices having a stripe of a 2 $\mu$m width must be formed in such narrow regions.

In addition, according to the processes disclosed in the Extended Abstracts G3.38 of the MRS Fall 1998 Meeting and the SPIE Proceedings, Vol. 3628, 1999, pp.158–168, defects also tend to gather in a plurality of regions in which laterally grown portions of the aforementioned second GaN layer coalesce, In addition, the dislocation is likely to extend in the thickness direction from the first GaN layer, which functions as a base of the growth of the second GaN layer. Therefore, the low-defect regions in the second GaN layer are very narrow, and the semiconductor laser devices having a stripe of a width of several micrometers must be formed in such narrow regions.

SUMMARY OF THE INVENTION

An object of the present invention is to provide a GaN substrate which is used in a semiconductor element, and in which the defect density is low in a wide region.

Another object of the present invention is to provide process for producing a GaN substrate which is used in a semiconductor element, and in which the defect density is low in a wide region.

Still another object of the present invention is to provide a semiconductor element which uses a GaN substrate in which the defect density is low in a wide region.

A further object of the present invention is to provide a semiconductor laser device which uses a GaN substrate in which the defect density is low in a wide region.

(1) According to the first aspect of the present invention, there is provided a GaN substrate comprising: a substrate; a first GaN layer being formed on the substrate and including a plurality of stripe portions which form at least one first groove between adjacent ones of the plurality of stripe portions; a second GaN layer formed over the substrate and the first GaN layer; a first preventing means, arranged at upper surfaces of the plurality of stripe portions, for preventing crystal growth of a GaN layer in the vertical up direction from the upper surfaces of the plurality of stripe portions; and a second preventing means, arranged at at least one bottom of the at least one first groove, for preventing crystal growth of a GaN layer in the vertical up direction from the at least one bottom.

The first GaN layer may be comprised of only said plurality of stripe portions. Alternatively, the first GaN layer may further comprise at least one bottom portion in the at least one first groove.

In the GaN substrate according to the first aspect of the present invention, the crystal growth of a GaN layer in the vertical up direction from the upper surfaces of the plurality of stripe portions of the first GaN layer is prevented by the first preventing means, and the crystal growth of a GaN layer in the vertical up direction from the at least one bottom of the at least one first groove formed between the plurality of stripe portions of the first GaN layer is prevented by the second preventing means. Therefore, in the initial stage of the crystal growth of the second GaN layer, the crystal grows only in the lateral directions. Thus, it is possible to prevent the dislocation which extends from a lower layer in the thickness direction, and occurs in the conventional GaN substrate. Consequently, the GaN substrate according to the first aspect of the present invention includes a wide, low-defect region.

Preferably, the GaN substrate according to the first aspect of the present invention may also have one or any possible combination of the following additional features (i) to (iv).

(i) The first preventing means may be realized by a dielectric film formed on the upper surfaces of the plurality of stripe portions.

In this case, the crystal growth of a GaN layer in the vertical up direction from the upper surfaces of the plurality of stripe portions of the first GaN layer can be effectively prevented.

(ii) The second preventing means may be realized by a dielectric film formed on the at least one bottom of the at least one first groove.

In this case, the crystal growth of a GaN layer in the vertical up direction from the at least one bottom of the at least one first groove formed between the plurality of stripe portions of the first GaN layer can be effectively prevented.

Therefore, the crystal growth of a GaN layer from the exposed side walls of the plurality of stripe portions of the first GaN layer can be promoted, and no defect extends from the at least one bottom of the at least one first groove in the thickness direction. Further, when the composition and the quality of the dielectric film is appropriately controlled, it is possible to prevent deterioration of crystallinity due to the inclination of the crystal axis which is caused by the stress generated in the vicinity of the dielectric film, and the like.

The dielectric films used as the first and second preventing means may be made of an oxide such as silicon oxide, titanium oxide, zirconium oxide, and aluminum oxide, or a nitride such as silicon nitride, aluminum nitride, and titanium nitride, or an oxynitride such as silicon oxynitride and aluminum oxynitride. Alternatively, the dielectric films may be a multilayer film made of any combination of the above films.

(iii) The GaN substrate according to the first aspect of the present invention may further comprise a low-temperature GaN buffer layer arranged under the plurality of stripe portions.

In this case, the low-temperature GaN buffer layer contributes to reduction of crystal defects in the GaN layer formed on the low-temperature GaN buffer layer.

(iv) The GaN substrate according to the first aspect of the present invention may further comprise, between the substrate and the first GaN layer, a low-temperature GaN buffer layer formed on the substrate, a third GaN layer formed on the low-temperature GaN buffer layer, and a dielectric film being formed on the third GaN layer and realizing the second preventing means.

In this case, the crystal growth of a GaN layer in the vertical up direction from the bottom of the first groove formed between the plurality of stripe portions of the first GaN layer can be effectively prevented.

(v) In the GaN substrate having the additional feature (iv), at least one portion of the dielectric film which is not located under the plurality of stripe portions of the first GaN layer may be removed so as to form at least one second groove, and make at least one gap between at least one bottom of the at least one second groove and the second GaN layer.

In this case, the second GaN layer can be formed by only the lateral growth from the exposed side walls of the first GaN layer, and it is therefore possible to prevent occurrence of a defect which extend from the at least one bottom of the at least one second groove in the thickness direction.

(vi) Each of the at least one first groove may have a width of 20 micrometers or greater.

In this case, since low-defect regions are realized in the second GaN layer except for the portions in which the laterally grown GaN portions coalesce, the low-defect regions in the GaN substrate can have a width of about 10 micrometers.

(2) According to the second aspect of the present invention, there is provided a semiconductor element having at least one semiconductor layer formed on a GaN substrate according to the first aspect of the present invention.

Since the semiconductor element according to the second aspect of the present invention is formed by growing semiconductor layers on the GaN substrate according to the first aspect of the present invention, the characteristics and reliability of the semiconductor element can be improved.

Preferably, the semiconductor element according to the second aspect of the present invention may also have one or any possible combination of the aforementioned additional features (i) to (vi).

(3) According to the third aspect of the present invention, there is provided a semiconductor laser device having a plurality of semiconductor layers formed on a GaN substrate, wherein a current injection window having a width of 10 micrometers or greater is formed in the plurality of semiconductor layers, and the GaN substrate is according to the first aspect of the present invention.

Since the semiconductor laser device according to the third aspect of the present invention is formed on the GaN substrate which includes a wide low-defect region, and the width of the current injection window is 10 micrometers or greater, the semiconductor laser device according to the third aspect of the present invention is reliable even when the semiconductor laser device operates with high output power.

Preferably, the semiconductor laser device according to the second aspect of the present invention may also have one or any possible combination of the aforementioned additional features (i) to (vi).

(4) According to the fourth aspect of the present invention, there is provided a process for producing a GaN substrate, comprising the steps of: (a) forming a first GaN layer on a substrate; (b) arranging at an upper surface of the first GaN layer a first preventing means for preventing crystal growth of a GaN layer in the vertical up direction from the upper surface of the first GaN layer; (c) removing at least one stripe area of the first preventing means and the first GaN layer from an upper surface of the first preventing means to a partial or full thickness of the first GaN layer or a partial thickness of the substrate so as to form at least one groove; (d) arranging at at least one bottom of the at least one groove a second preventing means for preventing crystal growth of a GaN layer in the vertical up direction from the at least one bottom; and (e) forming a second GaN layer over the first GaN layer and the substrate.

In the process according to the fourth aspect of the present invention, the GaN crystal grows only in the lateral directions in the initial stage of the crystal growth of the second GaN layer. Therefore, low-defect regions are realized in the second GaN layer except for the portions in which the laterally grown GaN portions coalesce. That is, a GaN substrate which includes a wide low-defect region can be produced by the process according to the fourth aspect of the present invention.

(5) According to the fifth aspect of the present invention, there is provided a process for producing a GaN substrate, comprising the steps of: (a) forming a first GaN layer on a substrate; (b) arranging on a plurality of portions of an upper surface of the first GaN layer a first preventing layer which prevents crystal growth of a GaN layer in the vertical up direction from the plurality of portions of the upper surface of the first GaN layer; (c) forming a second GaN layer over the first GaN layer and the first preventing layer; (d) removing at least one first portion of the second GaN layer so that a plurality of second portions of the second GaN layer remain only on all or a portion of the first preventing layer, and at least one groove is formed between adjacent ones of the plurality of second portions of the second GaN layer; (e) arranging, on at least one bottom surface of the at least one groove and upper surfaces of the plurality of second portions of the second GaN layer, a second preventing layer which prevents crystal growth of a GaN layer in the vertical up direction from the at least one bottom surface and the upper surfaces of the plurality of second portions of the second GaN layer; and (f) growing a third GaN layer from side walls of the plurality of second portions of the second GaN layer until an upper surface of the third GaN layer is planarized.

In the process according to the fifth aspect of the present invention, the GaN crystal grows only in the lateral directions in the initial stage of the crystal growth of the third GaN layer. Therefore, low-defect regions are realized in the third GaN layer except for the portions in which the laterally grown GaN portions coalesce. That is, a GaN substrate which includes a wide low-defect region can be produced by the process according to the fifth aspect of the present invention.

DESCRIPTION OF THE DRAWINGS

FIG. 4 is a cross-sectional view of a semiconductor laser device as the fourth embodiment of the present invention.

DESCRIPTION OF PREFERRED EMBODIMENT

Embodiments of the present invention are explained in detail below with reference to the drawings.

First Embodiment

Figure 1A:
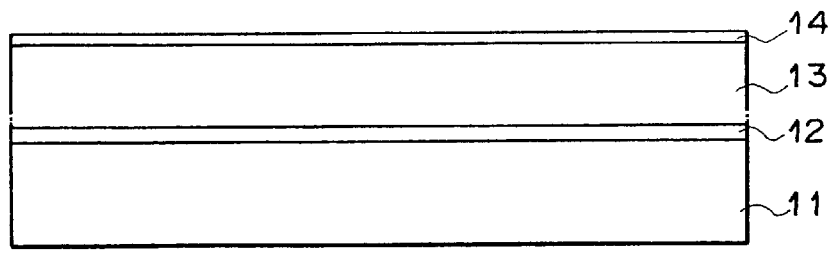
FIGS. 1A to 1C are cross-sectional views of representative stages of a process for producing a semiconductor substrate in the first embodiment of the present invention.
Figure 1B:
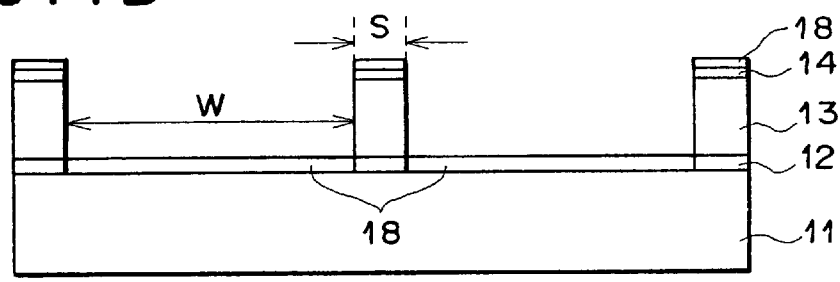
Figure 1C:
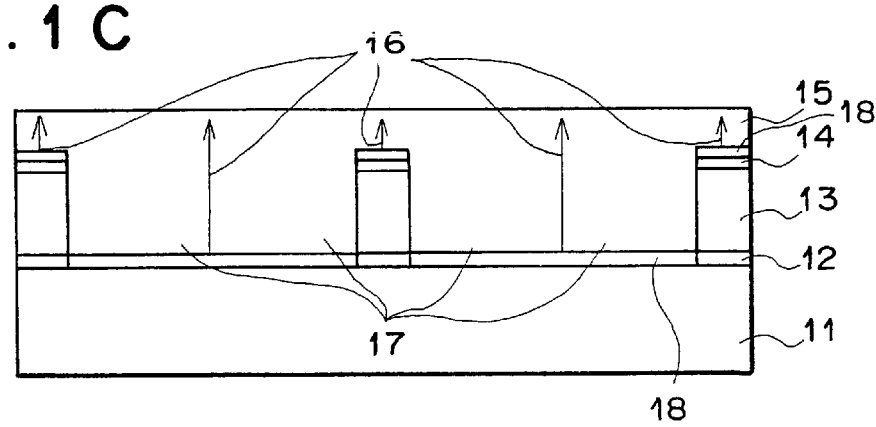

FIGS. 1A to 1C are cross-sectional views of representative stages of a process for producing a semiconductor substrate in the first embodiment of the present invention.

As illustrated in FIG. 1A, a GaN buffer layer 12 having a thickness of about 20 nm is formed on a (0001) face of a sapphire substrate 11 at a temperature of 500° C. by the normal pressure MOCVD (metal organic chemical vapor deposition) technique using trimethyl gallium (TMG) and ammonia as raw materials. Then, a GaN layer 13 having thickness of about 5 micrometers is formed on the GaN buffer layer 12 at a temperature of 1,050° C. Next, a $SiO_2$ layer 14 is formed on the GaN layer 13, and a resist film (not shown) is formed on the $SiO_2$ layer 14. Then, stripe areas of the $SiO_2$ layer 14 oriented in the <1$\bar{1}$00> direction are removed by the conventional photolithography, so as to form a line-and-space pattern comprised of $SiO_2$ stripes being spaced with intervals (w) of 30 micrometers and each having a width of 5 micrometers. Thereafter, the exposed areas of the GaN layer 13 and the GaN buffer layer 12 are removed to the depth of the upper surface of the sapphire substrate 11 by dry etching using chlorine gas as an etchant and the $SiO_2$ stripes 14 and the resist film as a mask. At this time, the sapphire substrate 11 may be etched. Then, the resist film is removed. Thus, stripe grooves are formed between the remaining portions of the GaN buffer layer 12 and the GaN layer 13. Next, a silicon oxynitride film 18 is formed over the above structure. At this time, thin silicon oxynitride films formed on the side walls of the remaining portions of the GaN layer 13 are removed by chemical etching using buffer HF (hydrofluoric acid). Thus, the structure as illustrated in FIG. 1B is obtained.

Next, as illustrated in FIG. 1C, a GaN layer 16 having thickness of about 20 micrometers is formed by selective growth at a temperature of 1,050° C. Due to growth in the lateral directions, the above stripe grooves between the remaining portions of the GaN buffer layer 12 and the GaN layer 13 are filled with the GaN layer 16, the remaining portions of the GaN buffer layer 12 and the GaN layer 13 are covered with the GaN layer 16, and finally the surface of the GaN layer 16 is planarized. Thus, the GaN substrate as the first embodiment of the present invention is completed.

In the construction of FIG. 1C, a dislocation which occurs at the boundary between the GaN substrate 11 and the GaN buffer layer 12, and extends in the thickness direction is stopped by the $SiO_2$ film 14. In addition, dislocations which occur at the bottoms of the stripe grooves can be controlled by the silicon oxynitride film 18. Therefore, defects are likely to occur only in the portions 16 in which the laterally grown GaN portions coalesce. Thus, wide, high-quality (low-defect) regions 17 are formed by the lateral growth. The low-defect regions 17 can have a width of 10 micrometers or greater.

Although the normal pressure MOCVD technique is used in the above process, the reduced pressure MOCVD technique may be used in order to promote the lateral growth. Alternatively, the hydride vapor phase epitaxy (HVPE) may be used in order to increase the speed of growth.

In addition, although the semiconductor layers are formed on the (0001) face of the sapphire substrate in the above process, the semiconductor layers may be formed on one of the other faces of the sapphire substrate, or one of various types of SiC substrate having various shapes such as 6H—SiC and 4H—SiC.

Second Embodiment

Figure 2A:
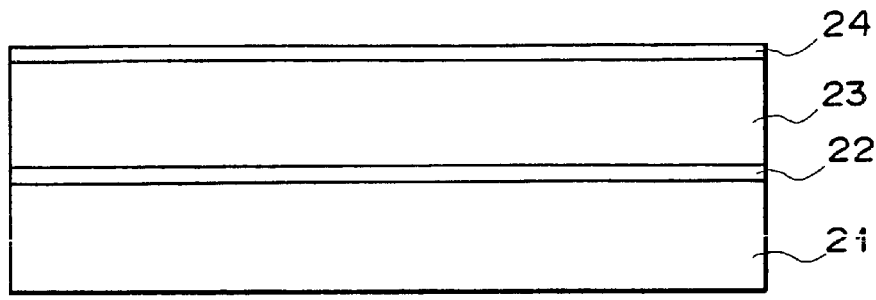
FIGS. 2A to 2C are cross-sectional views of representative stages of a process for producing a semiconductor substrate in the second embodiment of the present invention.
Figure 2B:
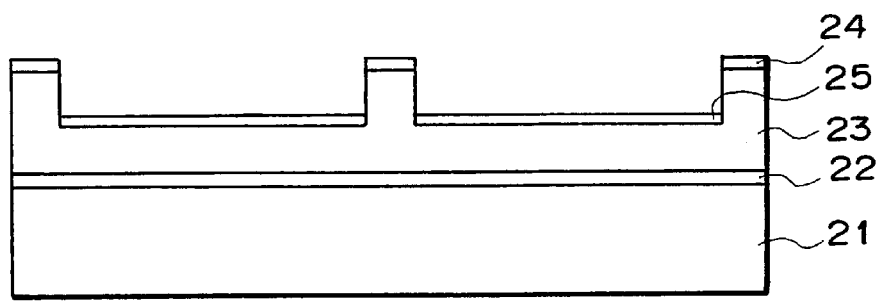
Figure 2C:
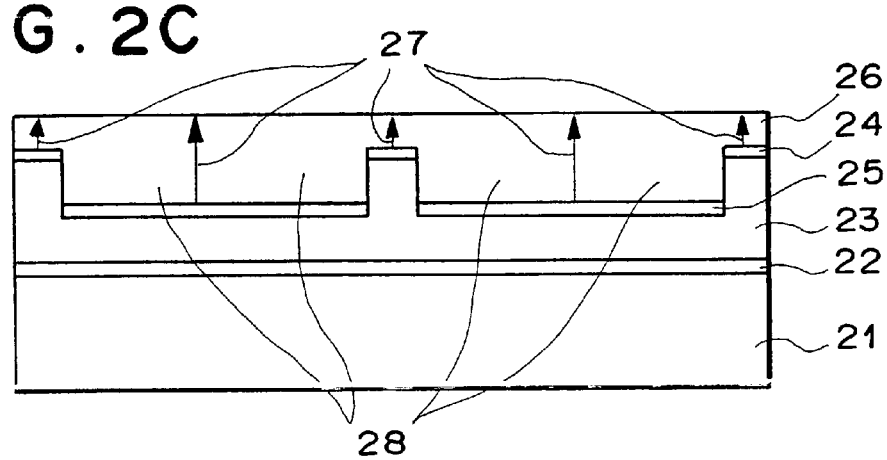

FIGS. 2A to 2C are cross-sectional views of representative stages of a process for producing a semiconductor substrate in the second embodiment of the present invention.

As illustrated in FIG. 2A, a GaN buffer layer 22 having a thickness of about 20 nm is formed on a (0001) face of a sapphire substrate 21 at a temperature of 500° C. by the normal pressure MOCVD technique using trimethyl gallium (TMG) and ammonia as raw materials. Then, a GaN layer 23 having thickness of about 5 micrometers is formed on the GaN buffer layer 22 at a temperature of 1,050° C. Next, a $SiN_x$ film 24 is formed on the GaN layer 23, and a resist film (not shown) is formed on the $SiN_x$ film 24. Then, stripe areas of the $SiN_x$ film 24 oriented in the <11$\bar{2}$0> direction are removed by the conventional photolithography, so as to form a line-and-space pattern comprised of $SiN_x$ stripes being spaced with intervals (W) of 25 micrometers and each having a width of 5 micrometers. Thereafter, the exposed areas of the GaN layer 23 are etched to the depth of about 5 micrometers by dry etching using chlorine gas as an etchant and the $SiN_x$ stripes 24 and the resist film as a mask. Then, the resist film is removed. Thus, stripe grooves are formed as illustrated in FIG. 2B. Next, a $SiO_2$ film 25 is formed over the above structure. At this time, thin $SiO_2$ films formed on the side walls of the GaN layer 23 are removed by chemical etching using buffer HF (hydrofluoric acid). Thus, the structure as illustrated in FIG. 2B is obtained.

Next, as illustrated in FIG. 2C, a GaN layer 26 having a thickness of about 20 micrometers is formed by selective growth at a temperature of 1,050° C. Due to growth in the lateral directions, the above stripe grooves are filled with the GaN layer 26, and finally the surface of the GaN layer 26 is planarized. Thus, a GaN substrate as the second embodiment of the present invention is completed.

In the construction of FIG. 2C, dislocations which occur at the boundary between the GaN substrate 21 and the GaN buffer layer 22, and extends in the thickness direction can be stopped by the $SiN_x$ film 24 and the $SiO_2$ film 25. Therefore, defects are likely to occur only in the portions 27 in which the laterally grown GaN portions coalesce. Thus, wide, high-quality (low-defect) regions 28 are formed by the lateral growth. The low-defect regions 28 can have a width of 10 micrometers or greater.

Third Embodiment

Figure 3A:
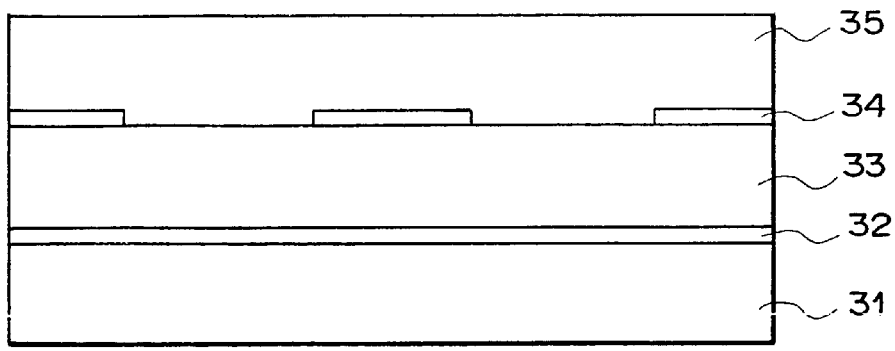
FIGS. 3A to 3C are cross-sectional views of representative stages of a process for producing a semiconductor substrate in the third embodiment of the present invention.
Figure 3B:
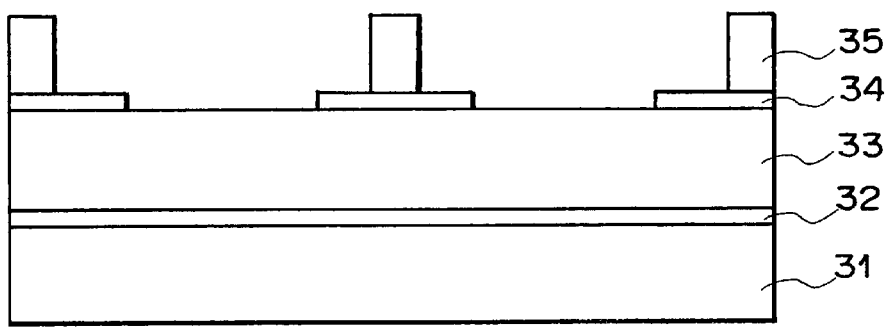
Figure 3C:
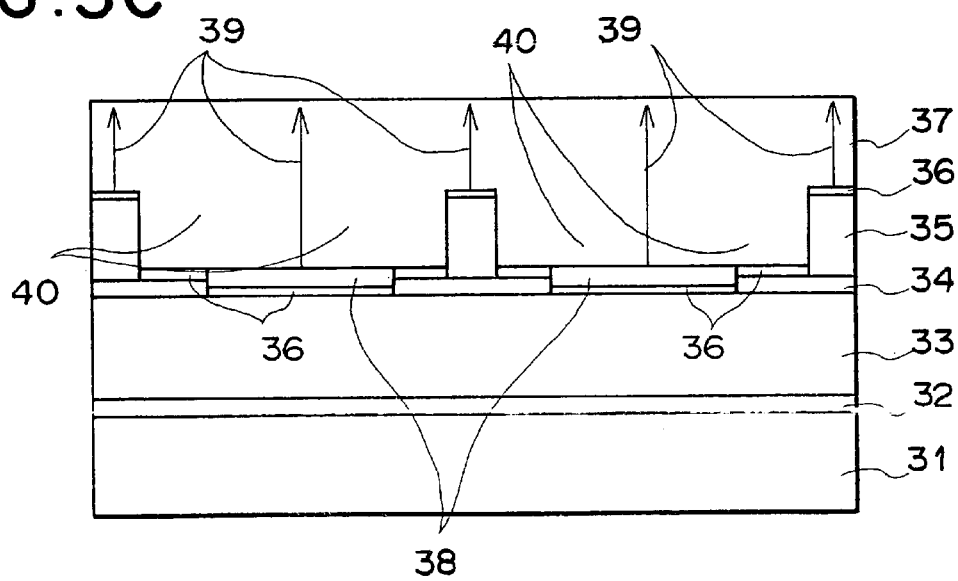

FIGS. 3A to 3C are cross-sectional views of representative stages of a process for producing a semiconductor substrate in the third embodiment of the present invention.

As illustrated in FIG. 3A, a low-temperature GaN buffer layer 32 having a thickness of about 20 nm is formed on a sapphire substrate 31 at a temperature of 550° C. by the normal pressure MOCVD technique. Then, a GaN layer 33 is formed on the low-temperature GaN buffer layer 32 at a temperature of 1,050° C. Next, a $SiN_x$ film 34 (having a thickness of about 0.5 micrometers) is formed on the GaN layer 33 by the plasma CVD technique, and a resist film (not shown) is formed on the $SiN_x$ film 34. Then, stripe areas of the $SiN_x$ film 34 oriented in the <1$\bar{1}$00> direction are removed by the conventional photolithography, so as to leave $SiN_x$ stripes 34 being spaced with intervals (W) of 20 micrometers and each having a width of 15 micrometers. Thereafter, a GaN layer 35, a $SiO_2$ film (not shown), and a resist film (not shown) are formed on the above structure.

Subsequently, stripe areas of the $SiO_2$ film oriented in the <1$\bar{1}$00> direction are removed by the conventional photolithography, so as to leave $SiO_2$ stripes being located above the above $SiN_x$ stripes 34 and each having a width of 5 micrometers. Then, the exposed areas of the GaN layer 35 are removed by dry etching using chlorine gas as an etchant and the $SiO_2$ stripes and the resist film on the $SiO_2$ stripes as a mask, until the GaN layer 33 is exposed. At this time, the GaN layer 33 may be etched. Next, the $SiO_2$ stripes and the resist film on the $SiO_2$ stripes are removed. Thus, stripe grooves are formed between the remaining portions of the GaN layer 35 and the $SiN_x$ film 34, as illustrated in FIG. 3B. Thereafter, a $SiN_x$ film 36 having a thickness smaller than that of the $SiN_x$ film 34 is formed over the above structure. Next, as illustrated in FIG. 3C, a GaN layer 37 having a thickness of about 20 micrometers is formed by selective growth at a temperature of 1,050° C. The above stripe grooves between the remaining portions of the GaN layer 35 and the $SiN_x$ film 34 are filled with the GaN layer 37 by the lateral growth of GaN from the side walls of the remaining portions of the GaN layer 35 without being in contact with the GaN layer 33, and finally the surface of the GaN layer 37 is planarized. Thus, the GaN substrate as the third embodiment of the present invention is completed.

In the construction of FIG. 3C, the GaN layer 35 is used as a base (seed) of the crystal growth, where the GaN layer 35 is formed by the lateral growth according to the conventional method as illustrated in FIG. 3A, and the defect density in the GaN layer 35 is low. In addition, gaps 38 are formed so that the GaN layer 37 is not in contact with the GaN layer 33. Therefore, it is possible to realize a high-quality GaN substrate in which the defect density is low in a wide region.

Fourth Embodiment

FIG. 4 is a cross-sectional view of a semiconductor laser device as the fourth embodiment of the present invention.

In the semiconductor laser device as the fourth embodiment of the present invention, the GaN substrate as the first embodiment of the present invention is used. The GaN substrate used in the semiconductor laser device of FIG. 4 includes the low-defect regions 17 being oriented in the <1$\bar{1}$00> direction and each having a width of 12 micrometers.

On the above GaN substrate, an n-type GaN layer 51, a superlattice lower cladding layer 52, an n-type GaN optical waveguide layer 53, a triple quantum well active layer 54, an p-type Al0.2Ga0.8N carrier block layer 55, a p-type GaN optical waveguide layer 56, a superlattice first upper cladding layer 57, an n-type $Al_{0.14}Ga_{0.86}N$ current confinement layer 58 having a thickness 0.8 micrometers, and an n-type GaN protection layer 59 having a thickness 2 nm are formed, where the superlattice lower cladding layer 52 is comprised of 150 pairs of GaN and n-type $Al_{0.14}Ga_{0.86}N$ sublayers each having a thickness of 2.5 nm, the triple quantum well active layer 54 is formed with n-type $In_{0.02}Ga_{0.98}N$ sublayers each having a thickness of 10.5 nm and n-type $In_{0.15}Ga_{0.85}N$ sublayers each having a thickness of 3 nm, and the superlattice first upper cladding layer 57 is comprised of 30 pairs of GaN and p-type $Al_{0.14}Ga_{0.86}N$ sublayers each having a thickness of 2.5 nm. Then, stripe regions of the n-type GaN protection layer 59 and the n-type $Al_{0.14}Ga_{0.86}N$ current confinement layer 58 each having a width of 10 micrometers are removed by photolithography and dry etching until the superlattice upper cladding layer 57 is exposed. The stripe regions are arranged right above the low-defect regions 17. Next, a superlattice second upper cladding layer 60 and a p-type GaN cap layer 61 are formed on the above structure by MOCVD, where the superlattice second upper cladding layer 60 is comprised of 120 pairs of GaN and p-type $Al_{0.14}Ga_{0.86}N$ sublayers each having a thickness of 2.5 nm, and the p-type GaN cap layer 61 has a thickness of 0.5 micrometers. Thus, an index-guided structure is formed. In addition, in order to activate magnesium as the p-type impurity, the above structure may undergo heat treatment in nitrogen atmosphere. Alternatively, the above semiconductor layers may be formed in nitrogen-rich atmosphere.

Thereafter, areas of the above semiconductor layers which do not include the index-guided structure, are etched off so that an area of the n-type GaN layer 51 is exposed as illustrated in FIG. 4. Then, a Ni/Au p-electrode 62 is formed on the p-type GaN cap layer 61, a Ti/Au n-electrode 63 is formed on the exposed area of the n-type GaN layer 51, and heat treatment is performed so that the p-electrode 62 and the n-electrode 63 are formed as ohmic electrodes. Next, the exposed surface of the sapphire substrate is polished, end surfaces of the resonant cavity are formed by cleaving the above layered structure, and a high-reflection coating and a low-reflection coating are laid on the end surfaces of the resonant cavity, respectively. Then, the construction of FIG. 4 is formed into a chip.

In addition, a semi-insulating silicon submount is provided. On the semi-insulating silicon submount, a pattern of electrodes and soldering materials is formed corresponding to the arrangement of the p-electrode 62 and the n-electrode 63 in the construction of FIG. 4. The epitaxially grown side of the construction of FIG. 4 is bonded to the semi-insulating silicon submount with solder. Further, the semi-insulating silicon submount is fixed to a gold-plated copper heatsink. Thus, the semiconductor laser device as the fourth embodiment is completed.

Although the stripe width of the conventional semiconductor laser device is about 2 micrometers, the stripe width of the semiconductor laser device as the fourth embodiment is five times greater than that of the conventional semiconductor laser device. In addition, the stripe structure in the semiconductor laser device as the fourth embodiment is formed on the above the low-defect, high-quality GaN substrate. Therefore, the semiconductor laser device as the fourth embodiment can operate with high output power, e.g., 100 to 200 mW, at an oscillation wavelength of about 400 nm.

When the active layer is made of an $In_zGa_{1-z}N$ material ($0 \leq z \leq 0.5$), the oscillation wavelength of the semiconductor laser device as the fourth embodiment can be controlled in the range of 360 to 550 nm.

The conductivity types of the semiconductor layers of the semiconductor laser device as the fourth embodiment may be inverted. That is, the n-type and the p-type may be exchanged.

Additional Matters (i) Although, in the embodiments of the present invention, silicon oxide, silicon nitride, are silicon oxynitride is used as a material which stops the crystal growth, another dielectric material exhibiting a good heat-resisting characteristic, such as titanium nitride, zirconium oxide, or the like, may be used as a masking material.

(ii) The semiconductor elements according to the present invention can include any semiconductor elements, for example, field effect transistors, semiconductor optical amplifiers, semiconductor light emitting devices, and semiconductor optical detectors.

(iii) In addition, all of the contents of Japanese Patent Application, No. 2000-004940 are incorporated into this specification by reference.

What is claimed is:

1. A GaN substrate comprising:
   a substrate;
   a first GaN layer being formed over said substrate, and including a plurality of stripe portions which form at least one first groove between adjacent ones of said plurality of stripe portions;
   a second GaN layer formed over said substrate and said first GaN layer;
   a first preventing means, arranged at upper surfaces of said plurality of stripe portions, for preventing crystal growth of a GaN layer in a vertical up direction from the upper surfaces of said plurality of stripe portions; and
   a second preventing means, arranged at at least one bottom of said at least one first groove, for preventing crystal growth of a GaN layer in a vertical up direction from said at least one bottom,
   wherein a width of said groove is wider than a width of each of said plurality of stripe portions, such that a ratio between the width of said stripe portions and the width of said groove is less than 1.

2. A GaN substrate according to claim 1, wherein said first preventing means is realized by a dielectric film formed on said upper surfaces of said plurality of stripe portions.

3. A GaN substrate according to claim 1, wherein said second preventing means is realized by a dielectric film formed on said at least one bottom of said at least one first groove.

4. A GaN substrate according to claim 1, further comprising a low-temperature GaN buffer layer arranged under said plurality of stripe portions.

5. A GaN substrate according to claim 1, wherein each of said at least one first groove has a width of 20 micrometers or greater.

6. The substrate according to claim 1, wherein said groove has a depth corresponding to a thickness of said first GaN layer to expose a material layer disposed under the first GaN layer.

7. The semiconductor substrate according to claim 1, wherein said groove has a width of 25 micrometers or more.

8. A GaN substrate comprising:

a substrate;

a first GaN layer being formed over said substrate, and including a plurality of stripe portions which form at least one first groove between adjacent ones of said plurality of stripe portions;

a second GaN layer formed over said substrate and said first GaN layer;

a first preventing means, arranged at upper surfaces of said plurality of stripe portions, for preventing crystal growth of a GaN layer in a vertical up direction from the upper surfaces of said plurality of stripe portions; and a second preventing means, arranged at at least one bottom of said at least one first groove, for preventing crystal growth of a GaN layer in a vertical up direction from said at least one bottom; and further comprising between said substrate and said first GaN layer, a low-temperature GaN buffer layer formed on said substrate, a third GaN layer formed on said low-temperature GaN buffer layer, and a dielectric film being formed on said third GaN layer, and realizing said second preventing means.

9. A GaN substrate according to claim 8, wherein at least one portion of said dielectric film which is not located under said plurality of stripe portions of said first GaN layer is removed so as to form at least one second groove, and make at least one gap between at least one bottom of said at least one second groove and said second GaN layer.

10. A semiconductor element having at least one semiconductor layer formed on a GaN substrate, said GaN substrate comprising:

a substrate;

a first GaN layer being formed over said substrate, and including a plurality of stripe portions which form at least one first groove between adjacent ones of said plurality of stripe portions;

a second GaN layer formed over said substrate and said first GaN layer;

a first preventing means, arranged at upper surfaces of said plurality of stripe portions, for preventing crystal growth of a GaN layer in a vertical up direction from the upper surfaces of said plurality of stripe portions; and a second preventing means, arranged at at least one bottom of said at least one first groove, for preventing crystal growth of a GaN layer in a vertical up direction from said at least one bottom, wherein a width of said groove is wider than a width of each of said plurality of stripe portions, such that a ratio between the width of said stripe portions and the width of said groove is less than 1.

11. A semiconductor element according to claim 10, wherein said first preventing means is realized by a dielectric film formed on said upper surfaces of said plurality of stripe portions.

12. A semiconductor element according to claim 10, wherein said second preventing means is realized by a dielectric film formed on said at least one bottom of said at least one first groove.

13. A semiconductor element according to claim 10, further comprising a low-temperature GaN buffer layer arranged under said plurality of stripe portions.

14. A semiconductor element according to claim 10, wherein each of said at least one first groove has a width of 20 micrometers or greater.

15. The semiconductor element according to claim 10, wherein said groove has a depth corresponding to a thickness of said first GaN layer to expose a material layer disposed under the first GaN layer.

16. The semiconductor element according to claim 10, wherein said groove has a width of 25 micrometers or more.

17. A semiconductor element having at least one semiconductor layer formed on a GaN substrate, said GaN substrate comprising:

a substrate;

a first GaN layer being formed over said substrate, and including a plurality of stripe portions which form at least one first groove between adjacent ones of said plurality of stripe portions;

a second GaN layer formed over said substrate and said first GaN layer;

a first preventing means, arranged at upper surfaces of said plurality of stripe portions, for preventing crystal growth of a GaN layer in a vertical up direction from the upper surfaces of said plurality of stripe portions; and a second preventing means, arranged at at least one bottom of said at least one first groove, for preventing crystal growth of a GaN layer in a vertical up direction from said at least one bottom; and further comprising between said substrate and said first GaN layer, a low-temperature GaN buffer layer formed on said substrate, a third GaN layer formed on said low-temperature GaN buffer layer, and a dielectric film being formed over said third GaN layer, and realizing said second preventing means.

18. A semiconductor element according to claim 17, wherein at least one portion of said dielectric film which is not located under said plurality of stripe portions of said first GaN layer is removed so as to form at least one second groove, and make at least one gap between at least one bottom of said at least one second groove and said second GaN layer.

19. A semiconductor laser device having a plurality of semiconductor layers formed on a GaN substrate, wherein a current injection window having a width of 10 micrometers or greater is formed in said plurality of semiconductor layers, said GaN substrate comprising:

a substrate;

a first GaN layer being formed on said substrate, and including a plurality of stripe portions which form at least one first groove between adjacent ones of said plurality of stripe portions;

a second GaN layer formed over said substrate and said first GaN layer;

a first preventing means, arranged at upper surfaces of said plurality of stripe portions, for preventing crystal growth of a GaN layer in a vertical up direction from the upper surfaces of said plurality of stripe portions; and a second preventing means, arranged at at least one bottom of said at least one first groove, for preventing crystal growth of a GaN layer in a vertical up direction from said at least one bottom wherein a width of said groove is wider than a width of each of said plurality of stripe portions, such that a ratio between the width of said stripe portions and the width of said groove is less than 1.

20. A semiconductor laser device according to claim 19, wherein said first preventing means is realized by a dielectric film formed on said upper surfaces of said plurality of stripe portions.

21. A semiconductor laser device according to claim 19, wherein said second preventing means is realized by a dielectric film formed on said at least one bottom of said at least one first groove.

22. A semiconductor laser device according to claim 19, further comprising a low-temperature GaN buffer layer arranged under said plurality of stripe portions.

23. A semiconductor laser device according to claim 19, wherein each of said at least one first groove has a width of 20 micrometers or greater.

24. The semiconductor laser device according to claim 19, wherein said groove has a depth corresponding to a thickness of said first GaN layer to expose a material layer disposed under the first GaN layer.

25. The semiconductor laser device according to claim 19, wherein said groove has a width of 25 micrometers or more.

26. A semiconductor laser device having a plurality of semiconductor layers formed on a GaN substrate, wherein a current injection window having a width of 10 micrometers or greater is formed in said plurality of semiconductor layers, said GaN substrate comprising:
    a substrate;
    a first GaN layer being formed over said substrate, and including a plurality of stripe portions which form at least one first groove between adjacent ones of said plurality of stripe portions;
    a second GaN layer formed over said substrate and said first GaN layer;
    a first preventing means, arranged at upper surfaces of said plurality of stripe portions, for preventing crystal growth of a GaN layer in a vertical up direction from the upper surfaces of said plurality of stripe portions; and
    a second preventing means, arranged at least one bottom of said at least one first groove, for preventing crystal growth of a GaN layer in a vertical up direction from said at least one bottom; and
    further comprising between said substrate and said first GaN layer,
    a low-temperature GaN buffer layer formed on said substrate,
    a third GaN layer formed on said low-temperature GaN buffer layer, and
    a dielectric film being formed on said third GaN layer, and realizing said second preventing means.

27. A semiconductor laser device according to claim 26, wherein at least one portion of said dielectric film which is not located under said plurality of stripe portions of said first GaN layer is removed so as to form at least one second groove, and make at least one gap between at least one bottom of said at least one second groove and said second GaN layer.

28. A GaN substrate comprising:
    a substrate;
    a first GaN layer being formed over said substrate, and including a plurality of stripe portions which form at least one first groove between adjacent ones of said plurality of stripe portions;
    a second GaN layer formed over said substrate and said first GaN layer;
    a first growth prevention layer, arranged at upper surfaces of said plurality of stripe portions, for preventing crystal growth of a GaN layer in a vertical up direction from the upper surfaces of said plurality of stripe portions; and
    a second growth prevention layer, arranged at at least one bottom of said at least one first groove, for preventing crystal growth of a GaN layer in a vertical up direction from said at least one bottom,
    wherein said groove has a depth corresponding to a thickness of said first GaN layer to expose a material layer disposed under the first GaN layer.

29. The substrate according to claim 28, wherein said groove has a width of 25 micrometers or more.

* * * * *